United States Patent
Dannels

(10) Patent No.: US 9,581,671 B2
(45) Date of Patent: Feb. 28, 2017

(54) MAGNETIC RESONANCE IMAGING WITH CONSISTENT GEOMETRIES

(71) Applicant: TOSHIBA MEDICAL SYSTEMS CORPORATION, Tochigi (JP)

(72) Inventor: Wayne R. Dannels, Mentor, OH (US)

(73) Assignee: Toshiba Medical Systems Corporation, Tochigi-Ken (JP)

(*) Notice: Subject to any disclaimer, the term of this patent is extended or adjusted under 35 U.S.C. 154(b) by 435 days.

(21) Appl. No.: 14/191,921

(22) Filed: Feb. 27, 2014

(65) Prior Publication Data

US 2015/0241537 A1 Aug. 27, 2015

(51) Int. Cl.
- G01R 33/56 (2006.01)
- G01R 33/565 (2006.01)
- G01R 33/561 (2006.01)
- G01R 33/563 (2006.01)

(52) U.S. Cl.
CPC .... *G01R 33/56554* (2013.01); *G01R 33/5611* (2013.01); *G01R 33/56341* (2013.01); *G01R 33/56581* (2013.01)

(58) Field of Classification Search
CPC .......... G01R 33/56554; G01R 33/5611; G01R 33/56341; G01R 33/56581
See application file for complete search history.

(56) References Cited

U.S. PATENT DOCUMENTS

| | | | |
|---|---|---|---|
| 4,591,789 A * | 5/1986 | Glover | G01R 33/56518 324/307 |
| 7,535,227 B1 | 5/2009 | Koch et al. | |
| 2007/0085538 A1 * | 4/2007 | Hinks | G01R 33/56554 324/309 |
| 2008/0054899 A1 * | 3/2008 | Aksoy | G01R 33/5611 324/307 |
| 2011/0260726 A1 * | 10/2011 | Techavipoo | G01R 33/246 324/309 |
| 2012/0002859 A1 * | 1/2012 | Huang | G01R 33/5611 382/131 |
| 2013/0314090 A1 * | 11/2013 | Taniguchi | A61B 5/055 324/322 |
| 2014/0037171 A1 * | 2/2014 | Bhat | G06T 11/003 382/131 |

(Continued)

OTHER PUBLICATIONS

Bruder et al., "Image Reconstruction for Echo Planar Imaging with Nonequidistant k-Space Sampling", Magnetic Resonance in Medicine 23, pp. 311-323 (1992).

(Continued)

*Primary Examiner* — Clayton E Laballe
*Assistant Examiner* — Ruifeng Pu
(74) *Attorney, Agent, or Firm* — Nixon & Vanderhye, P.C.

(57) ABSTRACT

A magnetic resonance imaging (MRI) system, method and/or computer readable medium is configured to effect MR imaging with reduced artifact by generating one or more image reconstruction maps from one or more prescans, acquiring a main scan dataset from a main MRI scan of an object, warping one or more image reconstruction maps to have geometric distortions substantially corresponding to geometric distortions in the main scan dataset, and forming a diagnostic MR image of the object using the main scan dataset and the warped one or more image reconstruction maps.

19 Claims, 7 Drawing Sheets

(56) References Cited

U.S. PATENT DOCUMENTS

2016/0139222 A1* 5/2016 Frydman .............. G01R 33/483
324/309

OTHER PUBLICATIONS

Buonocore et al., "Ghost Artifact Reduction for Echo Planar Imaging Using Image Phase Correction", 1997, pp. 80-100.
Chen et al., "Removal of EPI Nyquist Ghost Artifacts With Two-Dimensional Phase Correction", Magnetic Resonance in Medicine 51:1247-1253 (2004).
Xiang et al., "Correction for Geometric Distortion and N/2 Ghosting in EPI by Phase Labeling for Additional Coordinate Encoding (PLACE)", Magnetic Resonance in Medicine 57:731-741 (2007).
Xu et al., "Robust 2D Phase Correction for Echo Planar Imaging Under a Tight Field-of-View", Magnetic Resonance in Medicine 64:1800-1813 (2010).

* cited by examiner

```
1 loop slice= 1,S
2    loop coil= 1,C
3       split epi prescan kspace into evens, odds
4       2DFT evens , 2DFT odds, complex image results = even_prescan, odd_prescan
5       accumulate over coils, "total" += (odd_prescan * conjugate(even_prescan))
6    endloop
7    convert "total" to correction map with complex phasor values: "PH" = total / (ABS(total))
8    stretch middle of correction map "PH", result = "PHS"
9    loop coil= 1,C
10      generate a pair of pseudocoil maps, P(2*coil-1)=map(coil); P(2*coil)=map(coil) * PHS
11   endloop
12   combine into magnitude, MP= square root of sum of squares (over all coils, even_prescan images)
13   stretch middle of magnitude MP, result = MPS
14 loop, pass=1,last_pass
```

Figure 8A

```
15      loop coil=1,C
16          split main epi kspace into evens, odds
17          2DFT evens, 2DFT odds, complex image results = even_main, odd_main
18      endloop
19      loop pixel= 1, (NXM/R)
20          generate encoding matrix "MAT" of pseudocoils "p" at pixel alias locations, all 2*C pseudocoils
21          compute pseudoinverse matrix MINV
22          gather vector of pixel values, "col1" from all 2*C images (even_main and odd_main)
23          multiply matrix times column, result "col2" = MINV * col1
24          scatter "col2" result values to aliased pixel locations in unfolded image "CE"
25      endloop
26      convert complex image "CE" to magnitude "ME"
27      if pass LT (last_pass), then
28          form line integrals along phase encode direction for MPS and for ME, results = LP and LE
29          find shift distance value between corresponding amplitudes along LP and LE, result=DPE
30          apply shift DPE, distort correction map PHS, result = PHS2
31          scale shift,  DPE2 = (-1/(AG-1)) * DPE
32          apply rescaled shift DPE2, distort coil maps, results = "map2"
33          update pseudocoils, P(2*coil-1)=map2(coil);  P(2*coil)=map2(coil) * PHS2
34      endif
35      endloop
36      store magnitude image slice "ME" to database
37 endloop
```

MAGNETIC RESONANCE IMAGING WITH CONSISTENT GEOMETRIES

FIELD

The subject matter below relates generally to magnetic resonance imaging (MRI). In particular, the subject matter relates to reducing distortion artifact in MR images. In one example, the subject matter is related to reducing artifact in MR images acquired from echo planar imaging (EPI).

BRIEF DESCRIPTION OF THE DRAWINGS

FIGS. 8A and 8B illustrate example pseudo code for a technique to reduce artifacts in EPI imaging, according to one or more embodiments.

DETAILED DESCRIPTION

Figure 1:
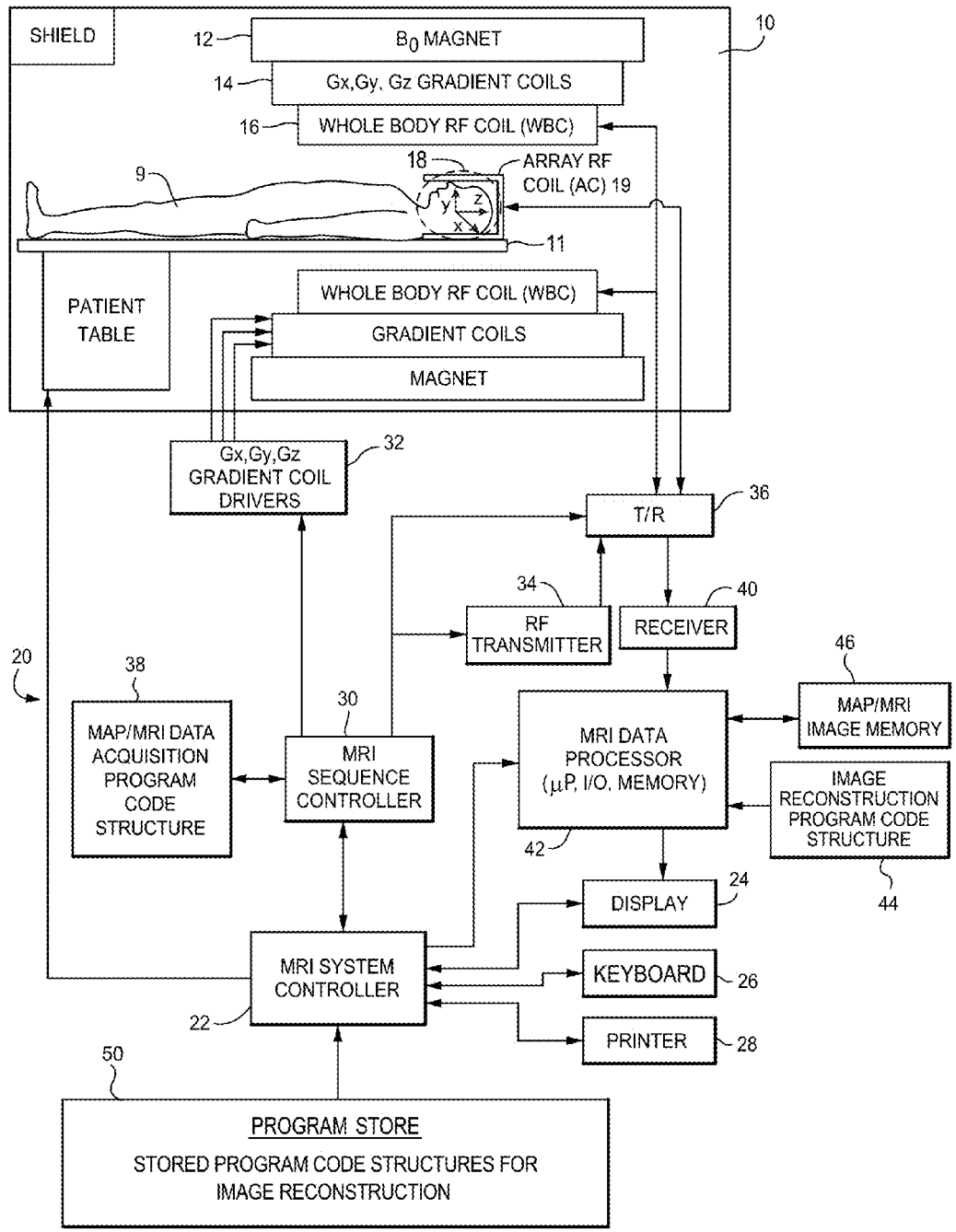
FIG. 1 is a high-level schematic block diagram of an MRI system adapted to reduce artifact associated with EPI imaging, in accordance with one or more embodiments.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field $B_0$ magnet 12, a Gx, Gy and Gz gradient coil set 14 and a large whole body RF coil (WBC) assembly 16. Along the horizontal axis of this cylindrical array of elements is an imaging volume 18 shown as substantially encompassing the head of a patient 9 supported by a patient table 11. One or more smaller array RF coils 19 might be more closely coupled to the patient head (referred to herein, for example, as "scanned object" or "object") in imaging volume 18. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils (PAC). These may include at least one coil configured to transmit RF signals into the imaging volume and a plurality of receiver coils configured to receive RF signals from an object, such as the patient head in the example above, in the imaging volume.

An MRI system controller 22 has input/output ports connected to a display 24, keyboard 26 and printer 28. As will be appreciated, the display 24 may be of the touch-screen variety so that it provides control inputs as well and a mouse or other I/O device(s) may be provided.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR, imaging) techniques including parallel imaging. MRI sequence controller 30 may be configured for EPI imaging and/or parallel imaging. Moreover, MRI sequence controller 30 may facilitate one or more preparation scan (prescan) sequences, and a scan sequence to obtain a main scan MR image (sometimes referred to as a diagnostic image). MR data from prescans may be used, for example, to determine sensitivity maps for RF coils 16 and/or 19 (sometimes referred to as coil sensitivity maps or spatial sensitivity maps), and to determine unfolding maps from parallel imaging. In one or more embodiments, a prescan, referred herein as a prescan EPI, is performed for one or more EPI main scans.

The MRI system 20 includes an RF receiver 40 providing input to data processor 42 so as to create processed image data, which is sent to display 24. The MRI data processor 42 is also configured for access to previously generated MR data, images, and/or maps, such as, for example, coil sensitivity maps, parallel image unfolding maps, ghost reduction maps, distortion maps (e.g., such as those depicting the difference between prescan EPI and main scan EPI images according to one or more embodiments) and/or system configuration parameters 46 and MRI image reconstruction program code structures 44 and 50.

Also illustrated in FIG. 1 is a generalized depiction of an MRI system program store 50 where stored program code structures (e.g., for image reconstruction with reduced or eliminated ghosting artifact, for defining graphical user interfaces and accepting operator inputs to same, etc.) are stored in non-transitory computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments described hereinbelow. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes an image reconstruction map (e.g., coil sensitivity map, unfolding map, ghosting map, a distortion map etc) generation process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure—as does a particular structure of computer control program codes that, when sequentially loaded into instruction registers and executed by one or more CPUs of the MRI system 20, causes a particular sequence of operational states to occur and be transitioned through within the MRI system.

The exemplary embodiments described below provide EPI images with reduced and/or eliminated ghosting artifact related to differences in image distortion. Although many of the embodiments described herein are directed to EPI, the techniques described herein for eliminating or reducing artifacts related to differences in image distortion may also be applied to MR images other than those acquired through EPI.

MRI images are formed by acquiring NMR (nuclear magnetic resonance) RF response signals (e.g. echo data) spatially encoded for respectively corresponding points in k-space. The RF response values are typically generated by "traversing" k-space in two or three dimensions according to a configured MRI pulse sequence. The acquisition of echo data in the frequency-encoded spatially-encoding direction (e.g., along the x-axis) is typically rapid and on the order of several milliseconds. However, along the phase-encoded axis (e.g., y-axis), a different value of the applied phase-encoding gradient is used to sample each point. Therefore, typically, the acquisition time for an MRI image is largely determined by the number of phase-encoding steps.

Parallel imaging enables the shortening of acquisition time by undersampling k-space along the phase-encoding direction. In many parallel imaging techniques, the number of sampled k-space points along the phase encoding direction is reduced, thereby significantly shortening the acquisition time. Instead of sampling each point along the phase-encoding direction, parallel imaging techniques enable the use of spatial RF transmit/receive patterns which provide spatially encoded signal strength and coil positioning information inherent in the RF coil(s) (e.g., phased array coils) to reconstruct the MRI image using the samples of fewer selected points along the phase-encoding direction. The reconstructed images based upon parallel imaging may also yield improved spatial resolution. Pruessmann K. P., et al., "SENSE: Sensitivity Encoding for Fast MRI," Magn. Reson. Med., 42:952-962, 1999, ("Pruessmann") the contents of which are hereby incorporated by reference in its entirety, describes a parallel imaging and reconstruction technique. Another example parallel imaging and reconstruction technique is SPEEDER™ which is available in MRI systems from Toshiba Inc.

EPI is another imaging technique for reducing the acquisition time. EPI is often used in MRI when speed is critical. EPI applications benefit from being able to take a complete 2D image in a single shot. 2D acquisitions (or 3D acquisitions) are created where a 2D k-space encoding is collected from a single excitation or a single spin coherence pathway. The single shot acquisition of a complete 2D image provide advantages, such as, for example, not having to compensate, or reducing the need for compensation, for patient motion (e.g., movement of the patient between acquisition shots) and the like. In EPI, it is common for one line of k-space encoded data to be collected in a time on the order of a millisecond, and for a 2D array of k-space encoded data to be collected in a time on the order of 20 to 120 milliseconds.

Single shot acquisition of a complete image is highly desired for applications such as, for example, diffusion (e.g., diffusion weighted imaging—DWI), functional MRI (FMRI), and perfusion (dynamic susceptibility contrast (DSC) enhancement or arterial spin labeling (ASL)). EPI is often required of MR vendors, for applications such as, for example, diagnosis of possible acute cerebral hemorrhage (stroke) with diffusion-weighted EPI.

However, EPI suffers from major distortions associated with, for example, susceptibility, chemical shift, imperfect shimming, and eddy currents. Hardware design of gradients, RF coils, shields and the like may produce gradient eddy currents, which make ghosts in EPI. Asymmetric RF receive frequency responses, or other imperfections lead to spatially dependent EPI ghosts. Conventional acquisition encoding and reconstruction can cause spatial misregistration of these distortions.

Spatial misregistration can occur in any type of MRI, but is often particularly significant in EPI. For efficiency reasons, both directions of the main scan EPI readout are utilized to sample distinct lines in k-space. Encoding inconsistencies between the two alternating polarity readouts introduce errors in standard reconstructions, especially the classic "Nyquist ghost" also known as "N/2 ghost."

Specifically, when k-space is traversed in a fast zig-zag pattern (e.g., alternating the readout (RO) gradient to retrace back and forth across k-space), the y-direction (e.g., the phase encoding direction, usually encoded using phase encode blips) is traversed more slowly than the x-direction (e.g., the frequency encoding direction). In effect, this results in the second gradient (e.g., in the phase encoding direction) at times being much weaker relative to the first gradient, therefore resulting in more significant distortion along the phase encoding direction. Unintended slower signal phase accumulation results in erroneous phase encoding, and especially spatial misregistration in the image phase encoding direction.

Parallel imaging is often included with EPI in order to reduce intrinsic distortions, and to maintain spatial resolution, especially at higher field strengths (e.g., 3T). Parallel imaging methods can reduce the effect of unintended signal phase accumulation relative to the intended applied phase encoding. Thus, geometric distortion can be reduced by a factor of the acquisition parallel imaging acceleration factor, often on the order of 2 or 3.

However, parallel imaging may introduce yet other distortion artifacts, such as reconstruction artifacts, in the output diagnostic images. Reconstruction artifacts are primarily due to the unfolding process that is required to obtain the desired diagnostic images based upon the intermediate images which are acquired by undersampling (in effect reducing the field of view) in the phase-encoding direction. "Unfolding" is the process of combining multiple aliased images in order to generate a desired diagnostic image. Often, the multiple aliased images vary from each other, in that each was collected from different RF receive coils.

Many parallel imaging techniques use two distinct image acquisitions to reconstruct the final diagnostic image. In addition to the main scan, a coil calibration prescan image also contributes to the final diagnostic image. The main scans are pixel aliased as a result of the reduced unaliased field of view. In some main scans, such as, for example, in EPI main scans, the MR signal may be misregistered (or displaced) before antialiasing compared to the corresponding coil calibration scan image (or corresponding coil sensitivity maps). If this discrepancy is not resolved, unfolding artifacts may be visible in the final diagnostic image. The most serious of these artifacts appear as areas of discrete aliases shifted in the phase encode direction. However, these artifacts can also appear as reduced signal at the particular locations or increased noise (decreased SNR), or a combination of some or all of these aspects.

In the main scan MRI images, it is often desired that the artifact levels for ghosting should be low, perhaps, for example, below 2% of the intensity of "correct" or "unghosted" signal. Thus, in the presence of susceptibility distortions or off-resonance intrinsic EPI distortions, effective 2D spatially dependent correction is needed.

Ghosting artifact in EPI images can be corrected to some extent with varying technical cost such as increased acquisition time or loss of single-shot temporal encoding. For example, conventional techniques such as the use of scalar estimates of data correction factors to reduce ghosting may be employed. Often, a zeroeth order constant and a first order constant can be applied to increase the consistency between the two polarities of readout in an image.

Other existing techniques for correcting for ghosting artifact in EPI, or in parallel imaging, or in EPI combined with parallel imaging include applying spatial variation in more sophisticated ghosting corrections. 1D corrections can be estimated and applied employing techniques such as that described in Bruder et al, "Image Reconstruction for Echo Planar Imaging with Nonequidistant k-Space Sampling," Magnetic Resonance in Medicine 23, 311-323, 1992, or in Buonocore et al, "Ghost Artifact Reduction for Echo Planar Imaging Using Image Phase Correction," Magnetic Resonance in Medicine 38(1), 89-100, 1997. 2D corrections can be estimated and applied using techniques such as those described in Chen et al, "Removal of EPI Nyquist Ghost Artifacts With Two-Dimensional Phase Correction," Magnetic Resonance in Medicine 51:1247-1253, 2004, in Xu et al, "Robust 2D Phase Correction for Echo Planar Imaging Under a Tight Field-of-View," Magnetic Resonance in Medicine 64:1800-1813, 2010, or in Dannels, U.S. patent application Ser. No. 13/914,160, filed on Jun. 10, 2013. U.S. patent application Ser. No. 13/914,160, is hereby incorporated by reference in its entirety.

Inversion of EPI distortions using multiple time shifted acquisitions or multiple directions of phase encoding are examples of techniques for correcting EPI geometric distortions. Xiang et al, "Correction for Geometric Distortion and N/2 Ghosting in EPI by Phase Labeling for Additional Coordinate Encoding (PLACE)," Magnetic Resonance in Medicine 57:731-741, 2007, described an example technique using multiple time shifted acquisitions. When EPI images are distorted, signal can "pile up", and multiple locations can map into a single distorted location, or large areas of signal can compress into much smaller areas. "Inverting" such areas may not be possible from single EPI shots.

According to some embodiments, parallel imaging corrections are performed using 2D parametric maps of coil sensitivities, and Nyquist ghost corrections are performed with 2D maps of phase correction parameters or complex-valued ghosting correction values. These correction maps are based upon MR data acquired by prescans.

When correction maps associated with a main scan EPI exhibit geometric distortions that are different than the geometric distortions of the main scan EPI image, effective spatial misregistrations exist between datasets in the reconstruction.

Embodiments described herein estimate the difference in distortion between one or more of the prescan images and the main scan image, and intentionally distort the prescan images such that they have substantially the same amount of distortion as the main scan image. The final reconstruction is then based upon one or more of the intentionally distorted prescan images and the main scan EPI image.

In one or more embodiments, the same prescan EPI can be used to determine the Nyquist ghost correction map and the intentionally distorted prescan EPI image. Moreover, the prescan EPI may be a prescan that is routinely performed, thus requiring no increase in overall acquisition time (or patient through-put). Further advantages of the embodiments are set forth below including at the end of this description before the claims.

Figure 2:
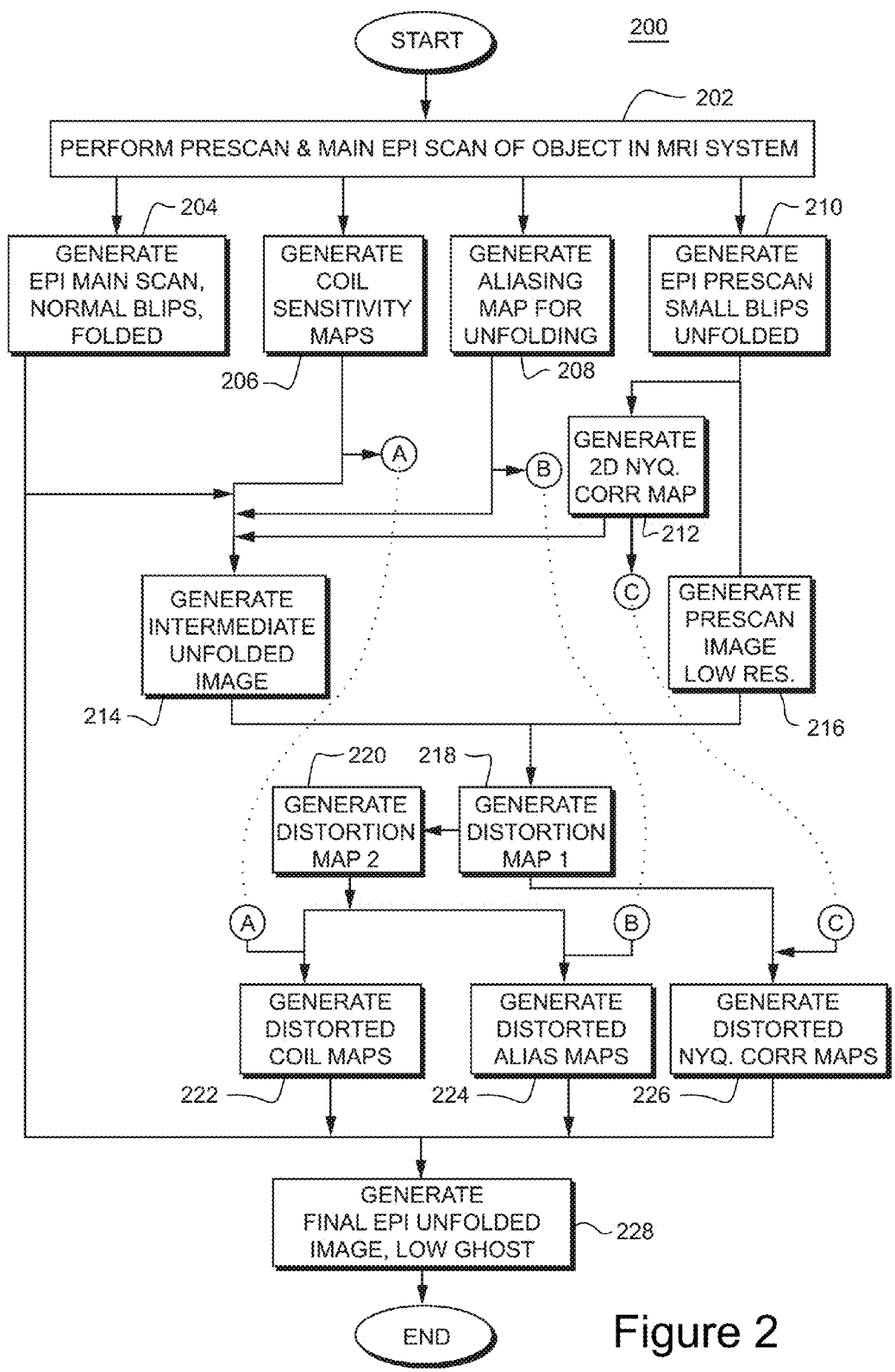
FIG. 2 illustrates a flowchart of a technique for reducing artifact in EPI images, in accordance with one or more embodiments.

FIG. 2 illustrates a flowchart of a method 200 for reducing or eliminating ghosting artifacts in an MRI system with EPI, in accordance with one or more embodiments. It will be understood that one or more of the operations 202-228 may not be performed, and/or may be performed in an order different from that illustrated in FIG. 2. Method 200, for example, may be performed and/or controlled by one or more of MRI data processor 42 and MRI system controller 22, and may access memories such as program store 50, image reconstruction program code structure 44, and image memory 46.

After entering the subroutine corresponding to method 200, operation 202 is performed by the MRI system in order to acquire MR dataset(s) corresponding to at least one main EPI scan, and one or more prescans including a prescan EPI.

Operation 202 includes collecting a main EPI scan (often with parallel imaging acceleration) MR data. The main EPI scan, as described above, includes significant amount of geometric distortion. The main EPI scan, if reconstructed by conventional techniques, routinely contains ghost artifacts, which are desired to be reduced or removed before a final MR image that is used, for example, for diagnostic purposes, is generated.

Operation 202 also includes collecting a prescan EPI dataset, and/or parallel imaging coil sensitivity prescan (often before the main EPI scan) dataset. These prescans typically have different amounts of distortion than the main scan EPI.

The prescan EPI is performed with reduced phase encoding strength so that the imaged object is shrunk in the FOV, and, as a result, has no overlap in the FOV due either to ghosts or to parallel imaging (alternatively, this may be considered as making the FOV larger in the phase encode direction). In practice, this effect is achieved by reducing the prescan EPI blips (e.g., phase encoding gradients) by a factor on the order of 2-3 relative to blips of the main scan EPI. The strength of the prescan EPI blips may additionally be reduced by the parallelization factor (e.g., a factor of 2-3 in many applications) being used with the parallel imaging, because prescan EPI is performed without parallel imaging. Thus, in some embodiments, compared to the main scan EPI with parallel imaging included, prescan EPI blips may be smaller by a factor, for example, of 4-9. The clear separation between the imaged object and ghosts in the prescan EPI enables the determination of how much signal is in the object and how much is in the ghost, and further beneficial information, such as the relative phase difference between main image signal and ghosting image signal at various locations.

Operation 202 also provides MR data from which an EPI main scan still folded image is generated at operation 204. Prescan MR data from operation 202 is used in generating one or more of a coil sensitivity map at operation 206, an aliasing map for unfolding at operation 208, and/or a prescan EPI image at operation 210. Coil sensitivity maps may be used in unfolding from aliased parallel imaging. Conventional techniques may be used for operation 202, and the forming of main scan EPI image at operation 204, coil sensitivity map at operation 206, aliasing map at operation 208, and prescan EPI image at operation 210.

The techniques for eliminating or reducing artifact, especially artifact caused at least in part by different geometric distortions, in accordance with one or more embodiments, provides the folded EPI main scan from operation 204 and one or more of images from operations 206, 208 and/or 210, as input to a novel improved process for correcting the geometric distortion differences. The example process for correcting geometric distortion differences computes the amount of pixel shift (e.g. shift of respectively corresponding pixels in differently distorted images) that would be required in order to match two of the images obtained from operations 204-210. Preferably, the shift amount is determined based upon the main scan EPI and the prescan EPI which have different distortions. The thus determined pixel-by-pixel shift amounts provide a relative distortion map.

The main scan EPI and the prescan EPI differ in the strength of the phase encode gradient employed in each. The amount of distortion, or the distance by which aspects of the main scan EPI image and the prescan EPI images are shifted, in the phase encode direction is relative to the strength of the gradient. For example, consider a prescan EPI and a main scan EPI where the main scan phase encode blips are six times larger than the prescan phase encode blips. In this example, the distortion in the prescan EPI image may be six times greater relative to the distortion in the main scan EPI in the phase encode direction. The distortion in the phase encode direction is by far the dominant geometric distortion. Background frequency errors become more significant relative to the phase encode gradient as the phase encode gradient becomes weaker.

At operation 212, a ghosting correction map is computed from the prescan EPI. The ghosting correction map is primarily a smooth, slowly varying function. In some embodiments, the ghosting correction map may be generated using techniques described in Dannels, which was incorporated by reference above.

At operation 214, one or more of the coil sensitivity map, the aliasing map for unfolding, and/or the 2D Nyquist correction map, generated respectively at operations 206, 208 and 212, are used to determine an intermediate unfolded EPI main scan image. This first unfolding of the main scan EPI may be performed in accordance with techniques described in Dannels, which was incorporated by reference above.

A prescan EPI image, which is of low resolution in the phase encode direction, is formed at operation 216. Conventional techniques may be used for determining the prescan EPI image. These techniques may include geometric stretching of the prescan image which was collected with smaller phase encode gradients. These techniques may also include isolation of a primary image from a non-overlapped ghost image, and/or appropriate recombination of ghost and primary images.

The intermediate unfolded main scan EPI image formed at operation 214 and the prescan EPI image formed at operation 216, are used in forming a first distortion map at operation 218.

Figure 3:
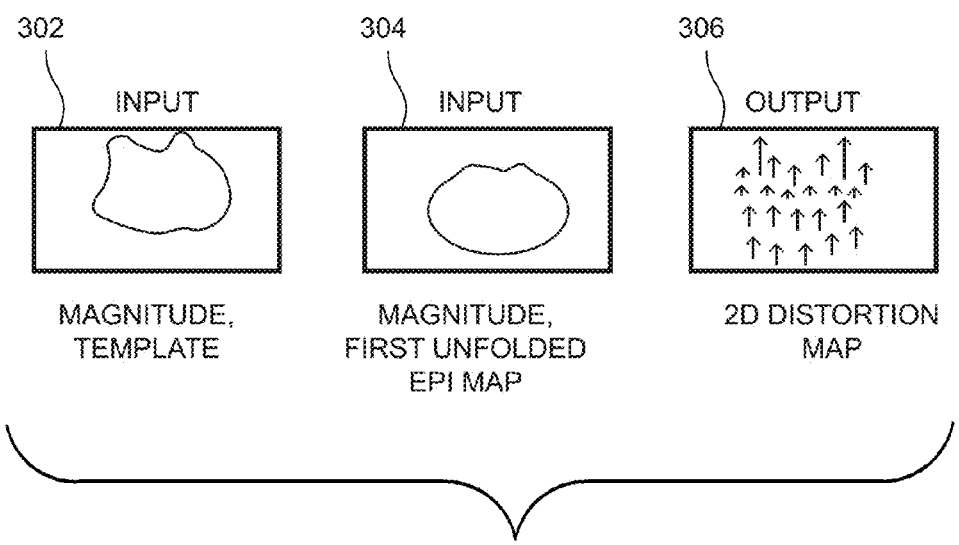
FIG. 3 illustrates sketches showing the estimation of a two-dimensional (2D) distortion map in accordance with one or more embodiments.
Figure 4:
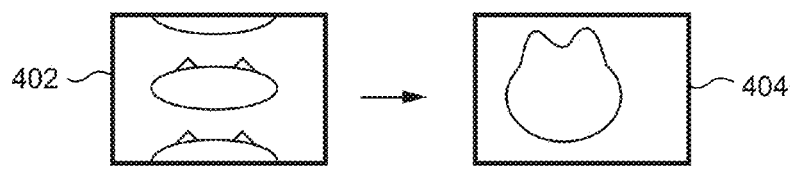
FIG. 4 illustrates expanding the field of view (FOV) in a prescan EPI image, in accordance with one or more embodiments.

As described above, a distortion map is a pixel-by-pixel quantification of the amounts by which a particular reconstruction image is to be distorted so that its geometric distortion substantially corresponds to the geometric distortion of intermediate unfolded main scan EPI image. In embodiments, a 2D distortion map representing the selected prescan EPI shot (i.e. template) is shifted from the main EPI scan in the phase encode direction may be used. FIG. 3, which is described below, illustrates estimation of shifts in a distortion map, in accordance with one or more embodiments. FIG. 4, which also is described below, illustrates expanding the FOV of the prescan EPI image so that it can be used in distortion estimation, in accordance with one or more embodiments.

Figure 5:
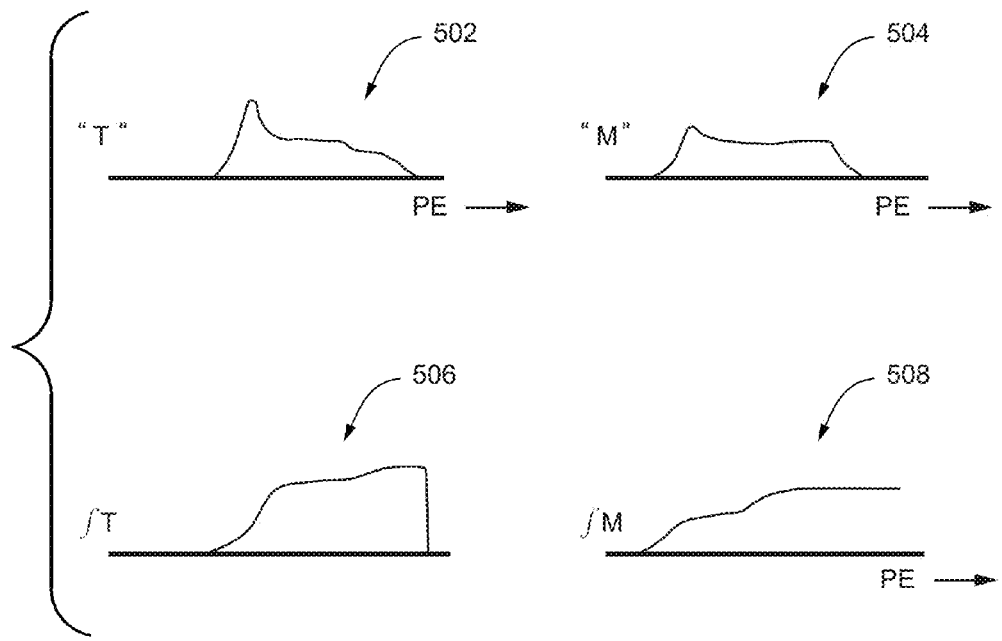
FIG. 5 and FIG. 6 graphically illustrate the estimation of a shift amount for correcting a main EPI image, in accordance with one or more embodiments.
Figure 6:
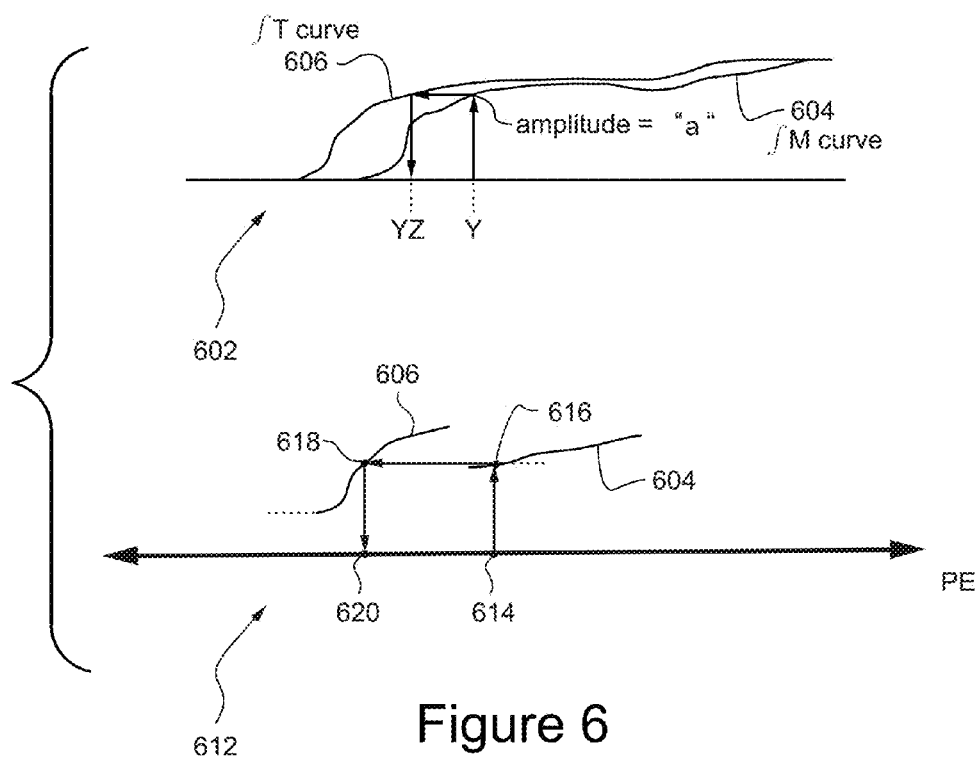

In an embodiment, the amount of distortion difference may be determined by identifying corresponding points in the two images—the image with moderate distortion (e.g., corresponding to MR data acquired with a stronger phase encode gradient—the main scan EPI) and the image with the large distortion (e.g., corresponding to MR data acquired with a weaker phase encode gradient—the prescan EPI). Corresponding points in the two images can be identified using the line integral method, according to some embodiments. FIG. 5 and FIG. 6, both of which are described below, illustrate determining the distortion difference, or the required amount of shift, at a position using the line integral method.

The first distortion map may be used to distort the Nyquist ghost correction map. At operation 220, a second distortion map may be formed by rescaling the first distortion map such that the second distortion map is an estimate of how the coil sensitivity map and/or the unfolding map are distorted relative to the main scan EPI.

To perform such a rescaling, first it maybe be beneficial to associate a sensitivity to frequency-induced geometry errors with each of the image acquisitions from operation 202. For example, when a main EPI acquisition has a given average phase encoding gradient strength, it may arbitrarily be assigned a sensitivity to geometric distortion of "1". Then, an EPI prescan with phase encode gradient reduced by a factor of 6 would have a relative geometric distortion from frequency-related shifts of "6". The coil sensitivity maps, possibly not acquired by EPI, may have zero effective distortion in the phase encode direction due to frequency shift mechanisms. Thus the distortion difference from the main EPI to the prescan EPI is "5" (i.e., 6 minus 1 in this example). The distortion difference from the EPI main scan to the coil sensitivity maps is minus 1 (i.e. 0 minus 1).

Correspondingly to rescale the amount of required induced distortion, we form a ratio, $-1/5=-0.2$ in this example. Hence, distortion value at each pixel in distortion map 1 is multiplied by $-0.2$ to yield a distortion map 2 pixel value. Possible refinements are contemplated in embodiments, if other distortion mechanisms might optionally be taken into account, such as concomitant gradient effects, or eddy currents from large diffusion encoding gradients, or slow thermally induced frequency shifts, or the likes.

At operation 222, the second distortion map is used to intentionally distort the coil sensitivity map generated at operation 206, so that the distorted coil sensitivity map has distortion substantially equal to the distortion in the main scan EPI image.

At operation 224, the second distortion map is used to intentionally distort the aliasing map generated at operation 208, so that the distorted aliasing map has distortion substantially equal to the distortion in the main scan EPI image.

At operation 226, the first distortion map is used to intentionally distort the Nyquist correction map which was generated at operation 212, so that the distorted Nyquist correction map has distortion substantially equal to the distortion in the main scan EPI image.

Figure 7:
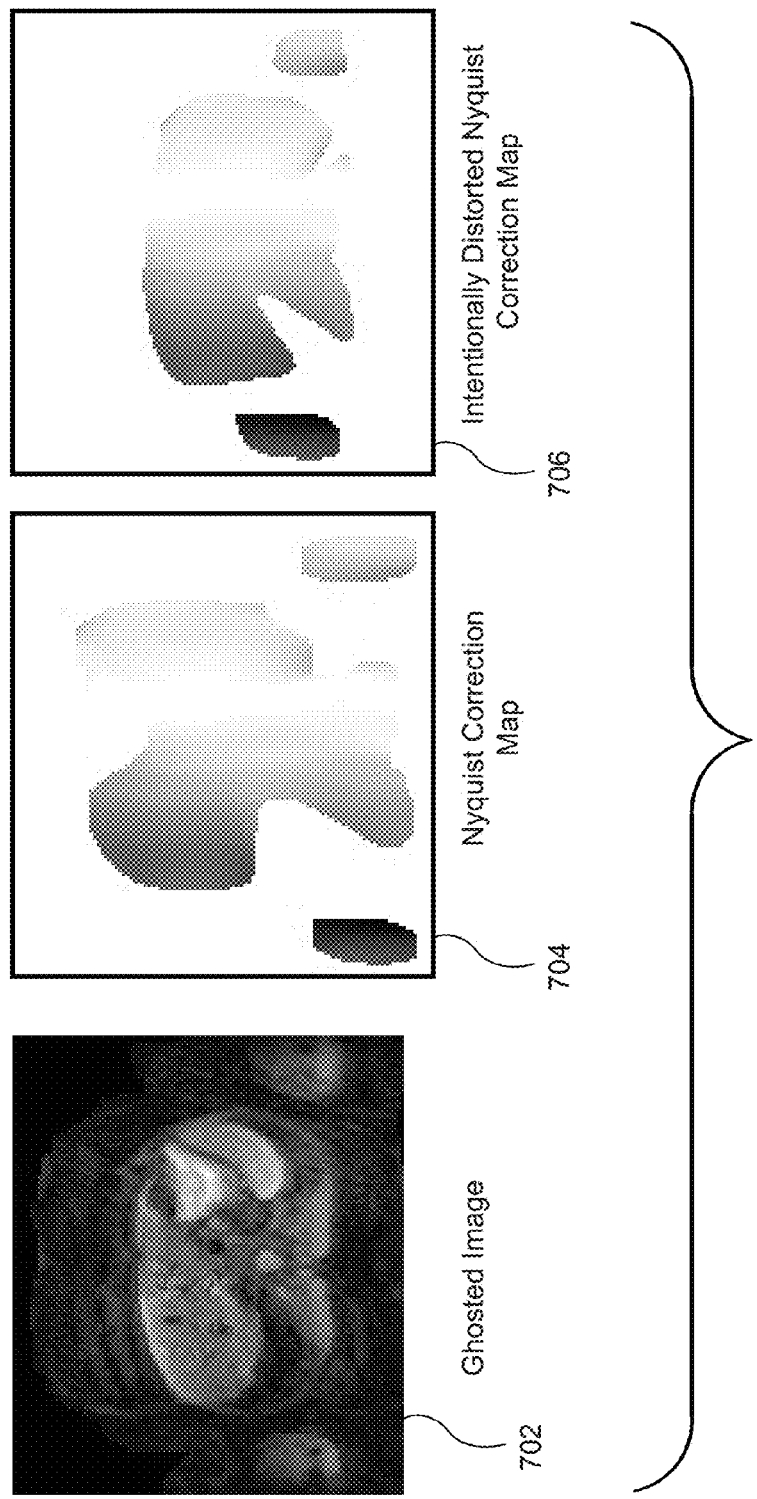
FIG. 7 illustrates examples of a ghosted image, of a correction map, and a modified correction map in accordance with one or more embodiments.

FIG. 7, which is described below, illustrates a ghosted image, such as that would be generated based upon MR data acquired by a main scan EPI of an object located in an imaging volume, a conventional Nyquist correction map based upon one or more prescans of the object, and a intentionally distorted Nyquist correction map, in accordance with one or more embodiments.

At operation 228, a final EPI diagnostic image, unfolded, and with low ghosting, is reconstructed by using the folded main scan EPI image from operation 204, and one or more of (a) the intentionally distorted coil sensitivity map, (b) the intentionally distorted alias map and/or (c) the intentionally distorted Nyquist correction map, generated, respectively at operations 222, 224 and 226. Note that this is the second reconstruction of the main scan EPI data. Whereas the first reconstruction was performed without geometric distortion correction, the second reconstruction is now performed with geometric distortion correction. The second reconstruction includes ghost elimination using the intentionally distorted Nyquist correction map, and unfolding/reconstruction using the intentionally distorted coil sensitivity map, the intentionally distorted alias map, all of which now have geometries that are consistent with the main scan EPI.

In embodiments described, note that attention is oriented to the relative geometric distortions between separate image or map components in the reconstruction process. This does not require explicit geometric correction of any distortions which would occur in the main EPI image by itself. The embodiments herein could be used either in combination with, or independently without, processes to attempt explicit geometric correction of the main distorted EPI image. Such distortion correction of the main EPI image has been discussed in literature, and entails difficulties and advantages which are largely independent of the methods described here. The embodiments described here are primarily concerned with reduction of discrete aliasing of EPI signal, to locations associated with readout gradient alternation effects (Nyquist ghosts), parallel imaging artifacts, or combinations of these two artifact mechanisms.

FIG. 3 illustrates sketches depicting the estimation of a 2D distortion map, such as for example, the first or second distortion maps described above, in accordance with one or more embodiments. A distortion map, as noted above, in an embodiment, shows how far the selected prescan EPI shot (also referred to herein as a "template") is shifted from the main scan EPI in the phase encode direction.

302 is a schematic sketch of an image from a prescan EPI shot. A schematic sketch 304 illustrates an image from a corresponding main scan EPI that would typically follow the prescan. The main scan EPI image may be formed subsequent to an unfolding process. Sketch 306 schematically illustrates an estimated 2D distortion map that may be obtained by comparing the unfolded main scan EPI image 304 with the prescan EPI image 302, in order to determine differences in distortion at respective positions.

The direction of the arrows in 306 indicate the direction of the distortion at each particular point (e.g., pixel), and the size of the arrows represent the magnitude of the distortion (e.g., the magnitude of the shift). The distortion template or map thus includes a vector quantity (direction and magnitude) at each position. 306 illustrates, for example, that the prescan EPI is shifted in varying amounts in the phase encode direction when compared to the main EPI image. If the direction of shifts is assumed to be constant, then only shift magnitude data need be shared in the shift template.

FIG. 4 illustrates expanding the field of view (FOV) in the prescan EPI image, in accordance with one or more embodiments.

As shown in sketch 402, the original prescan EPI image is "squeezed." The squeezing of the image is due to the phase encode blips used in the prescan being made small, so that, as seen in 402, the actual image of the object is clearly separated from the ghosts, such as, as shown here, Nyquist ghosts.

The prescan EPI image 402 can be stretched by a configured or dynamically determined stretch factor so that it may have the same FOV as the main EPI image, so that it can be used for distortion estimation. Expansion by a factor from 2-4 is typical, although other factors are possible and are contemplated in embodiments. Sketch 404 illustrates prescan EPI image 402 after being stretched to a full FOV.

When multiple receive coils are used, in practice it is usually necessary to combine images from distinct coils to make a correction map suitable for use across a complete image. "Sum of Squares" coil combinations are simple and very effective when magnitude images are needed, and when parallel imaging combinations such as SENSE are not used. Various parallel imaging reconstructions however imply different effective coil combinations mechanisms, or different implied spatial intensity weightings. Thus, if multiple images are to be used in computation, considering whether different spatial combination techniques, or different spatial weightings, could cause problematic intensity differences may be beneficial.

In one example, the prescan EPI image from 216 may exhibit "Sum of Squares" weighting.

$$\text{sum of squares "uniformity"} = \sqrt{\Sigma_i \sigma_{AC_i} \cdot \sigma_{AC_i}^*} \quad (1)$$

Yet the unfolding operation of 214 might conceivably use relative sensitivity maps where coil ratios are formed between array coils $\sigma_{ac_i}$ and a comparatively uniform whole body coil (WBC) receive image.

$$\text{Unfolding at each pixel, use maps, } MAP_{ac_i} = \frac{\sigma_{ac_i}}{WBC} \quad (2)$$

As is well known, the overall spatial weighting of such an unfolded image, would then be substantially that of the whole body coil image.

$$\text{SENSE unfold uniformity} = WBC \quad (3)$$

Then, to allow pixelwise operations between those two image results, it may be necessary to modify one or both images, so that they share a single spatial weighing. In the example, one such corrective modification would be to multiply the unfolded image from 214, pixelwise, by a spatial weighting correction, such as $$\text{uniform\_correction} = \sqrt{\sum_i (MAP_{ac_i} \cdot MAP_{ac_i}^*)} \quad (4)$$

The exact correction for different coil combinations techniques, or for different parallel imaging algorithms, depends completely upon the specific combination methods, and the specific parallel imaging methods, of course.

FIG. 5 and FIG. 6 illustrate a technique for determining shift amounts using the line integral method, in accordance with some embodiments. According to the line integral method, the total amount of signal along a vertical line is preserved, such that, if the image is stretched locally, the signal along the vertical line may be shifted up or down that line. Thus, at a selected pixel in the image with less distortion, it may be considered, for example, that 45% of the signal is below the selected point on the line integral and 55% of the signal is above the point. In the normalized line integral curve corresponding to the image with less distortion, such a point has amplitude of 0.45. By identifying a point in the normalized line integral of the image with the higher distortion that has the same proportion of signal (e.g. 45% below the point to 55% above, in this example) as that in the image with the moderate distortion, a corresponding pixel in the image with the higher distortion can be identified. Then, the amount of shift between the two images is the difference between the locations of the two corresponding pixels. Note that, in the manner above, points corresponding to any signal value can be determined.

This may be repeated for each pixel. In some embodiments, the above process may be repeated only for every nth pixel on a row and/or column where n is 2 or greater. The above technique is not limited to estimating shift distances only at discrete pixel center locations. Intermediate positions between discrete pixels may be determined by interpolation. Similarly, the above described technique is not limited to determining shift displacements that are discrete multiples of pixels sizes. In effect, the amplitude value for an intermediate position between two discrete pixels would be a combination, in certain percentages, of the amplitudes of the two discrete pixel displacements.

Interpolating to the level of pixel fractions would help avoid a stepping effect in the corrected images which may occur if the corrections were restricted to only apply entire discrete pixel displacements.

According to an embodiment, a distortion map is formed by repeating the above pixel by pixel. For each position the distortion map includes a positive or negative shift in an amount of pixels in the phase encode direction.

502 and 504 are sketches, respectively, of a corrected uniformity prescan EPI and a main unfolded EPI (for each column of main scan or prescan image, e.g., for each line in phase encode direction). The graphs 502 and 504 are identified respectively as "T" (e.g. for template) and "M" (e.g. for main EPI).

506 and 508 show the results of, respectively, integrating "T" and integrating "M" along the phase encode direction. Once the integral of T shown in 506 and the integral of M shown in 508 are determined, the shift at each position can be estimated. For example, for each position y on the curve representing the integral of M, find the amplitude a. Then a point corresponding to amplitude a is identified in the curve representing the integral of T. Subsequently, a location yz is identified in the curve representing the integral of T. Then the shift at y is determined as (y-yz).

A more detailed view of the estimation outlined with respect to FIG. 5 is illustrated in FIG. 6, in accordance with one or more embodiments.

602 illustrates the curve 606 representing the integral of T and curve 604 which represents the integral of M drawn in the same sketch. The value of curve 604 corresponding to location y on the phase encoding axis is selected as an amplitude a. The next step is to identify location yz on the phase encoding axis which corresponds to amplitude a on curve 606.

612 illustrates a close-up, zoomed-in view of the area of the curves 604 and 606 that are most relevant to the determination of yz. Starting at point 614 corresponding to y, point 616 which represents amplitude a on curve 604 is determined. This, of course, is the position that corresponds to phase encode value of y on curve 604. Next, a point 618 on curve 606 is identified which has the same amplitude as position 616. On the illustrated graph, point 618 may be identified diagrammatically by extending a horizontal line from curve 604, so that it intersects curve 606 at 618.

After point 618 is identified, then the corresponding location yz on the phase encode axis is determined. Point 620 represents yz which corresponds to point 618 on curve 604.

Thus, the shift at point 614 is the difference between point 614 and point 620. Put another way, the shift at point y can be stated as y-yz.

FIG. 7 illustrates a ghosted image 702, such as that would be generated based upon MR data acquired by a main EPI scan of an object located in an imaging volume. Also shown is a conventional Nyquist correction map 704 that is generated, in accordance with conventional techniques, based upon one or more prescans of the object.

Also shown is a second correction map 706, which is formed by modifying the conventional Nyquist ghost correction map 704 to have the same (or substantially the same) distortion as the ghosted image 702, in accordance with an embodiment. It can be observed that the similarity between ghosted image 702 and modified Nyquist ghost correction map 706 is substantially greater than the similarity between ghosted image 702 and conventional Nyquist correction map 704. Modification of the Nyquist ghost correction map causes it to have consistent geometry with main EPI scan.

In the described embodiments, the readout direction is not corrected. The amount of distortion in the readout direction, when compared to the distortion in the phase encode direction, is minimal and can be ignored. However, embodiments are not limited to only correcting distortion in the phase encode direction.

In the above described embodiments, shifts and distortions are performed on correction maps which are inherently smooth. This yields the advantage that errors due to relatively small amounts of noise in the data do not cause significant errors in the final image. For example, with a smooth correction map, effecting a 2.8 pixel shift instead of 2.6 pixels as actually required would cause the correction map to be off by 0.2. But because it's a smooth map, this would not cause major errors in the image. Only very small, second order, or errors undetectable in the final image would be caused. In contrast, if shifts and distortions were to be performed upon the main EPI image, which may have sharp image characteristics (e.g., an image feature that drastically changes between two adjacent pixels), an error such as above, would show up as a 20% error. That 20% error could result in a sharp edge being drastically changed, perhaps resulting in ghosts.

Prior art attempted to get rid of the distortion in the main EPI image itself, such as by taking two main images with different phase encodes. But such techniques may be subject to errors caused by taking scans at different time instants, and to some extent such techniques lose the advantages of a single shot EPI.

If there were a 10% ghost before, now, after effective Nyquist correction, there might be a 1% error. Now assume that a mild error was made in the Nyquist map, and instead of moving 2.2 pixels, it caused movement of 2.6 pixels. This may result in the ghost becoming a 1.1% error or even a 2% ghosting error, but this is greatly preferable to throwing an error on the order of 40% of a sharp edge onto the main EPI diagnostic image.

FIGS. 8A and 8B illustrate example pseudo code for a technique to reduce or eliminate distortion-induced ghosting in EPI, according to one or more embodiments. According to an embodiment, the example pseudo code of FIG. 8 may correspond to aspects of an implementation of method 200 described above in relation to FIG. 2.

Pseudo code lines 1 and 37 indicate that, in embodiments, the algorithm implemented by the pseudocode for reconstructing main scan EPI images with reduced or eliminated artifacts is used on 2D slices. Each slice may be reconstructed independently. A "slice" to which the reconstruction algorithm is applied may be a spatially distinct geometric slice location (as would often be called 2D multislice imaging), a distinct time repetition in a dynamic imaging process (as is common for contrast-enhanced perfusion imaging, or for BOLD functional imaging or brain activity, etc.), or the different slices may apply to repeatedly imaging the same geometric location, but with distinct signal contrast mechanisms prepended to the EPI readouts, such as is common with diffusion weighted imaging, or diffusion tensor imaging, or diffusion fiber tracking applications.

When applying the reconstruction algorithm to slices of different types (time series, or distinct DWI signal weightings, etc.), it may be beneficial to collect only one prescan EPI shot acquisition for each main scan shot at a given geometric location. Thus, several 2D images (here, loosely called "slices") may be intended for later processing and analyses as a set. By utilizing a single or common prescan EPI acquisition for the reconstruction of each of the "slices" (at a given physical location), at least two advantages are obtained.

The first advantage is that the amount of time spent on prescans is less. The second advantage is that using the same prescan for all temporal main scans in time series, means that no incidental variation is imposed into the reconstruction process, and the fluctuations in the reconstructed time series of main EPI scans can be interpreted as coming from only the main EPI scans in the time series of acquisition, as opposed to coming from some indeterminate mixture of both main EPI scans, and fluctuations in the (multiple) prescans.

Embodiments provide for using a prescan with one or more main EPI scans without sacrificing the one-acquisition-one-output-image characteristic of EPI, and are thus more advantageous for interpreting time series effects, or for allowing faster scanning of a series of DWI contrasts, etc., than conventional techniques that sacrifice the one-acquisition-one-output-image characteristic.

Pseudo code lines 2-6 illustrate that this reconstruction converts from k-space data to spatial domain images. Each physical coil's data may be handled separately. For each coil, the acquired k-space data is split into two datasets, one which corresponds to positive polarity readout gradients, and one which corresponds to negative polarity readout gradients. For sake of illustration, without loss of generality, one might perform the even-numbered readouts with positive gradients, while the odd-numbered readouts are performed with negative polarity readout gradients. The successive lines are separated by phase encoding steps.

Although not explicitly shown in the pseudocode, the k-space data for one polarity of readout is "reversed" in the reconstruction, relative to the other polarity of readout. This is well known in EPI. For example, if even lines are deemed to be collected with "positive" readouts, then maybe the odd lines are reversed before the Fourier Transform reconstruction operation is applied to the data. Alternatively, one could reverse the odd image in the readout direction after 2DFT, etc.

A convenient way to split the data into even k-space sets and odd k-space sets is to copy the full dataset so as to have two versions of it. In what will become the even set, one could start with the full dataset, and replace all of the odd lines with (complex) zero values. To generate the odd dataset, one could start with a full dataset, and replace all even-line data with zeroes. Other techniques for forming the odd/even datasets are possible and are contemplated within embodiments.

The prescan EPI data which is acquired and used in pseudo code lines 3-5, especially, is acquired with smaller phase encode blips, compared to the traditional amplitude of blips that would be used with regular FOV EPI scans. The smaller blips, probably smaller by a factor in the range of 2.0 to 3.0, lead to a reduction of the apparent size of the object, by a corresponding factor of 2.0 to 3.0 in the phase encode direction. The purpose of this is to contract the main image and contract the Nyquist ghost image sufficiently, that they do not overlap in the reconstruction. Thus, the normal reconstruction (before or without separating into even and odd parts), would yield images with one central portion of main image, and an outermost image of the Nyquist ghost signal. Separating the main image from the ghost (preventing pixels to overlap), allows for forming a clear ratio of the two parts, as done in pseudocode lines 5, 7, and 8. Examples of this operation are disclosed in Xu et al. noted above.

Processing steps may then be used to (A) form the pixelwise ratio of the main signal to the Nyquist ghost signal, to (B) restrict this ratio so as to represent complex phase variations, but not complex amplitude information, and to (C) combine information from distinct RX coils. However, embodiments are contemplated, leaving out any of (A), (B) or (C). For example, Dannels, U.S. application Ser. No. 14/017,894, filed Sep. 4, 2013, which is incorporated herein in its entirety, describes some advantages of leaving out the step of restricting corrections maps to phase information only, and advantages of maintaining distinct correction maps for distinct coils, etc.

In the pseudocode embodiment, line 5 performs both the function (A) of making a pixelwise phase ratio (e.g., because multiplication by the conjugate generates the same complex phase angle as complex division), and function (C) of combining coil data with a particular amount of amplitude weighing in the combination step. Line 7 of the pseudocode performs the function (B) of restricting the ratio to phase angle information, not magnitude operation.

At pseudo code line 8, the correction map is stretched. The phase encode blips of the prescan have been reduced in strength, but the nominal placement of the k-space array into a matrix of given size and spacing has not been modified relative to the normal way of collecting the traditional full field of view scan. Thus, since the phase encode blips are intentionally "wrong", being acquired with less gradient encoding than the traditional full field of view, probably by a factor in the ranges of 2-3, the traditional 2DFT reconstruction would yield and image where the nominal object size has been compressed relative to the user-prescribed phase encode FOV.

To utilize the geometrically compressed correction map "PH", the complex-valued correction map "PH" is resampled and stretched in the phase encode direction, by the same factor by which the prescan blips were reduced, e.g., a factor probably in the range of 2 to 3.

The order of operations represented by pseudo code lines 7 and 8 may be reversed.

The result of pseudo code line "8", as described in this embodiment, is a Nyquist correction map, nominally of the correct full FOV, but which may include spatially varying distortions which are different than the spatially varying distortions in the main scan EPI images, etc.

Pseudo code lines 9-11 represent that, for each receive coil (RX coil), two idealized "pseudocoils" are generated. The pseudocoils are determined such that the complex ratio difference factor between the two pseudocoils matches the difference between the even and odd images (or equivalently, between the positive readouts and the negative readouts).

In this example, the even pseudocoil sensitivity maps (subscripted here as 2*coil−1) correspond to the traditional sensitivity maps acquired with a SENSE prescan or SPEEDER prescan (not to be confused with the EPI prescan). In this example, the odd pseudocoils (subscripted here as 2*n) are formed by applying an extra ratio factor, as calculated in pseudocode line 8.

The input sensitivity coil maps "map(i)", nominally have the correct full FOV, but may include spatially varying distortions which are different than the spatially varying distortions in the main EPI images, and further may be different from distortions in the EPI prescan images.

In pseudo code lines 12 and 13, the nominally compressed prescan EPI images are stretched, and are converted to a combined or composite image. Here, the composite image has sum-of-squares type combination. Other forms of coil combinations may be contemplated, especially if the same effective final composite weighting is imposed later in the main EPI images by virtue of the detailed implementation of pseudocode lines 20-24. For example, these combined images may or may not be divided by the weighting of a large and substantially uniform whole body receive coil, as is common in some SENSE reconstruction implementations, etc.

The combined image, the magnitude prescan stretched image, "MPS", in this embodiment, has substantially the same T1 and T2 weighting, etc. as the main EPI scan, i.e., the output of pseudocode line 24.

Pseudo code lines 14 and 35 indicate that an EPI reconstruction is performed (at least) twice. In the embodiment of the pseudocode program, the first pass reconstruction is done without explicit correction of displacement or spatial distortion errors.

In the simplest case, "last_pass" has the value of 2, there are two successive reconstructions of the main EPI data.

Suppose for now "last_pass"=2. In the second pass, another complete construction is performed, but this time spatial distortion corrections have been applied to the EPI Nyquist correction map, and to the SENSE or SPEEDER coil sensitivity maps.

Note that it is also contemplated that an implementation with more iterations could be somewhat more accurate. With a higher number of iterations of the loop at line 14 (e.g., "last_pass" equal to or greater than 3), the magnitude main scan EPI images "ME" generated in pseudocode line 26, and used at line 28, should have less Nyquist ghosting, and should therefore be better overall matches to the EPI prescan images "MPS." When the number of iterations is increased, the need to recalculate prescan images may be reduced, since the ghosting in the prescan images is shifted off the images by the reduced phase encode blips and subsequent restretching in the image domain.

Pseudocode lines 15-18 are similar to pseudocode lines 2, 3, 4 and 6. The lines 15-18 are applied to the main scan EPI image, which in the case of parallel imaging, is performed so that the raw images associated with each coil or each channel area are aliased in the phase encode direction. In the main scan EPI image acquisition, it is beneficial to apply a stronger phase encode gradient, by a factor which is the parallel imaging acceleration factor (or parallel imaging factor) "R". It is common that the acceleration factor might be in the range of 2 to 3, but fractional accelerations like 1.6, or larger accelerations like 4.0 can also be used depending on considerations of signal-to-noise, RX coil geometry, and the likes.

When the parallel imaging factor causes use of larger phase encode gradient blips, and a smaller effective phase encode FOV than the nominal phase encode FOV associated with the effective final FOV prescribed by the user, note that this factor is distinct from the reduction factor associated with the EPI prescan gradient blips. For example, suppose the prescan gradient blips (as described in relation to pseudocode lines 2-6) are a factor of 2 smaller than nominal. Also suppose that the parallel imaging factor is R=3.0. Then the total difference in the phase encode blips is an aggregate factor ("AG") of 6.0. This would mean that geometric distortions main (parallel imaging) EPI scan are 6.0 times as large as those in the EPI prescan images. This aggregate factor is utilized in pseudocode line 31.

Note that no coil combination is performed in lines 15-18, since the independent information associated with the distinct coil sensitivities to accomplish the parallel imaging unfolding in lines 19-25 is needed.

Pseudocode lines 19-25 represent a parallel imaging reconstruction, similar to Pruessmann, but extended to make use of "pseudocoils", an implementation of which is described in Xu.

"N" and "M" are the sizes of the desired final image, in pixels. "R" is the parallel imaging acceleration factor applied along the phase encoding direction in 2D parallel imaging.

As noted above in relation to pseudocode lines 12-13, there can be various weightings or normalizations associated with SENSE reconstructions. In pseudocode lines 19-25, although not called out explicitly, it is highly beneficial that the spatial weighting in the output of line 13 (MPS) should have the same weighting as the output "ME" from lines 19-25 and line 26.

In pseudocode line 21, the matrix inversion is preferably regularized to form a pseudo inverse matrix MINV, and to avoid excessive noise gain in the situations where the encoding matrix (the output "MAT") is numerically close to rank R1<R, i.e. where the "Rth" singular value of MAT has much lower magnitude than the largest singular value).

Pseudocode line 19 indicates that the technique loops over each of the pixels in a reduced FOV version of the image, i.e. in a folded image, as opposed to the unfolded image.

Pseudocode lines 27-34 compute a spatial distortion (DPE) between the EPI prescan and the EPI main parallel imagining scan. This amount of distortion can be used to directly warp the Nyquist correction map, such that it has the same distortion as the main parallel imaging EPI scan. Then, this distortion map can be rescaled, to be an estimate of how the coil sensitivity maps, in turn, are distorted relative to the main EPI parallel imaging images. The rescaled distortion (DPE2) is used, in turn, to warp the coil sensitivity maps so that they also have geometric distortion that matches the distortion of the main parallel imaging scan.

In pseudocode line 27, "last pass" may be 2 or larger, as mentioned in relation to line 14.

At pseudocode line 28, the signal is integrated in each column of the image, along the phase encode direction, for both the magnitude prescan stretched image (MPS), and for the main EPI image (ME).

Optionally, it may be beneficial to normalize the two line integrals. If for example, the prescan image is the first acquisition, and if the subsequent main EPI scan is slightly saturated because the TR did not allow for complete recovery of the MZ equilibrium magnetization, the total integral of the ME signal may be somewhat less than the total integral of the MPS image signal. In such a case, the ratios of the complete line integral across the PE FOV may be determined, perhaps at a given column resulting in values "LP" for the prescan total line integral, and "LE" for the main EPI scan total line integral. Then at the end of processing for line 28, or at the beginning of processing for line 29, the line integrals may be normalized with respect to each other. For example, each pixel of the line integral from the column of MPS may be divided by the final unnormalized value of LP, and, each pixel of the line integral from the column of ME may be divided by the final unnormalized value of LE. Other variants, such as only normalizing the line integrals of ME by factors of (LM/LE) for each column, only normalizing the line integrals of MPS by factors of (LE/LM) for each column, are obviously possible and are contemplated in embodiments.

At pseudocode line 29, for each pixel location "Y" along each column of line integral image LE, the value of the line integral is found (denoted by a value "VEY"). Then, the line integral of MPS may be traversed along the same column. In the case where the values of MPS and ME are magnitude pixels (non-negative real values), and in the case where each line integral has been normalized, so values range from zero to 1.0, each line integral may be considered as a monotonic function, and finding a matching value may be guaranteed, if, for example, interpolation is performed along, say, the column line integral in MPS.

For the given "Y" location in LE, the amplitude "VEY" is determined. A search for the value "VEY" along the line integral of MPS is then performed. Allowing for a possible interpolation of the increasing values in the column line integrals of MPS, a new "YP" value, i.e. a corresponding y location, which subdivides the image such that total signal of "VEY" lies "below" the dividing point "YP", and total signal (1−VEY) lies "above" the dividing point is obtained. This point "YP" may be a good estimate of where the corresponding original point "Y" is, if LE and LM are vary only by a difference in distortions. Therefore, a displacement distance "DPE"=(Y−YP) which is the differential distortion in the two images, can be generated either from point YP in the prescan or from point Y in the main EPI scan.

Other distortion estimations are plausible, and are contemplated as embodiments. For example, a 2D deformable deformation software function may be used to constrain the deformations to be displacement fields only along the phase encode direction (not the PE direction and the readout RO direction), and a deformation map which is locally smooth, and which drives a mutual information metric to the appropriate extreme may be determined. However, the line integral technique described above is computationally fast and efficient, since evaluating all of the values of DPE along one column can be done in an incremental fashion, where each search for YP can progress starting from the location of the previous YP. Thus, both Y and YP "walk" in a single direction across the respective line integral images, perhaps "Y" making uniform steps of a single pixel, and "YP" taking non-uniform steps, though most of the time "YP" is expected to move approximately one pixel at a time.

In pseudocode line 30, we note that the displacement map "DPE" is substantially what is needed to make "MPS" match "ME". But "MPS" is derived from the same or similar physical measurement as "PHS" from pseudocode line 8, and so PHS is amenable to the same or similar warping operations as "MPS". Applying the distortion map "DPE", "PHS" can be distorted along the phase encode direction (along the column), so that it has nominally the same distortion as "ME" and "CE".

As the remaining operations indicate, an improved PHS can then be used.

Note that warping "MPS" may be preferable to trying to warp especially the aliased images "even_main" and "odd_main", since each pixel in 'even_main" and in "odd_main" actually corresponds to a superposition of various aliased pixels, and the displacement distance "DPE" which would be correct for one pixel in an aliased set, will not in general be correct for the other aliased pixels location.

In pseudocode line 31, as indicated above in relation to pseudocode lines 15-18, the distortion in MPS (and PHS) is "AG" times the distortion in ME (and CE). But the distortion in the coil sensitivity maps is routinely much smaller, and can be considered to be zero in comparison. Therefore, if the distortion DPE(Y) happened to have a given value, it may be considered as being DPE(y)=(AG*(DPE0)−1*(DPE0)), where DPE0 is the absolute distortion in ME. AG is known to be a simple constant. Thus, the above may be solved for DPE0. In particular, DPE=(AG−1)*DPE0. Therefore the distortion from ME to each "map" is DPE2=DPE*(−1/(AG−1)).

At pseudocode line 32, DPE2 is applied to each sensitivity map, analogously to pseudocode line 30.

At pseudocode line 33, the improved PHS2 and map2 are combined to make new pseudocoil sensitivity maps, in a manner analogous to pseudocode lines 9-11, but now with the respective components "map2" and "PHS2" having been corrected to have substantially the same distortions as "CE" and "ME", and hence "map2" and "PHS2" are both derived from the same (distorted) locations as "CE" and "ME", and hence they should be derived from mutually consistent locations, and should have the correct values to perform reconstruction (pseudocode lines 19-26) without error due to spatial misregistration between the various maps and main scan data.

The embodiments described above with respect to FIGS. 1-8 enable EPI with or without parallel imaging, simultaneously perform Nyquist deghosting, and has immunity to off-resonance or susceptibility misregistration between various maps and main EPI scan. The prescan EPI can be used for both Nyquist deghosting and for reducing geometric distortions.

Compared to conventional techniques that rely upon corrections being applied to the main scan images, embodiments disclosed herein apply the corrections to reconstruction maps that are of lower resolution, thereby yielding a technique that is more resistant to spatial jitter introduced in the corrections. For example, if the quality of the spatial correction degrades, the effect is degradation of ghost rejection, but ghosts are already low, so this is a second order effect, compared the errors from directly unfolding the main EPI image without consideration for differing distortions.

Also, in embodiments, ghosting is reduced, but, unlike conventional EPI spatial correction methods, there is no mixing of the main scan information content between two or more shots of data acquisition.

Further, because the EPI prescan is already routinely performed for EPI scans, the total scan time is no longer than conventional EPI, yet more correction is performed. EPI prescan is typically 1-2 shots done at the beginning of the EPI scan, and not shown to the user. Multiple uses may be made such as ghost reduction, to reach equilibrium in signal, to ensure T1 equilibrium (normalize the T1/TR contrast), to determine optimum receiver gain. By using the same prescan EPI for determining the distortion map, embodiments achieve the capabilities described above without increasing scan time.

Still further, no shot-to-shot variations are introduced into a time series, for example in FMRI or ASL or DCE perfusion applications. True temporal variations are not "filtered" or "blurred" or "fitted." A single distortion map may be applied to multiple main scans in a time series.

Nyquist corrections are of higher spatial order, and therefore capable of correcting errors with spatial variations, such as localized eddy currents, or mechanical vibrations, or frequency dependence which varies in coil arrays.

Subsequently, the final EPI images can be subjected to various post processing functions, such as, for example, partial k-space homodyne filtering correction, radio frequency image uniformity correction, gradient distortion correction, and the like. The final diagnostic images are obtained from the final EPI images or post processed final EPI images.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) system for effecting MR imaging with reduced distortion, said MRI system comprising:
   an MRI gantry including a static magnetic field coil, gradient magnetic field coils, at least one radio frequency (RF) coil configured to receive nuclear magnetic resonance (NMR) RF signals from an object located in the imaging volume;
   an MRI sequence controller configured to perform an MR imaging sequence comprising at least one or more prescans and at least one main scan of the object; and
   at least one digital data processor coupled to receive digital data responsive to the MR imaging sequence from said at least one RF coil, said at least one digital data processor being configured to:
   generate one or more image reconstruction maps from one or more received prescan digital datasets;
   acquire at least one main scan dataset from received main scan digital data;
   warp the one or more image reconstruction maps to include geometric distortions substantially corresponding to geometric distortions in the at least one main scan dataset;
   form a diagnostic MR image of the object using the at least one main scan dataset and the warped one or more image reconstruction maps; and
   output the diagnostic MR image to a display, or data storage in a non-transient digital data storage medium, or an outbound data transmission port.

2. The MRI system of claim 1, wherein the at least one main scan is an echo planar imaging (EPI) main scan, and wherein the one or more prescans include an EPI prescan producing an EPI prescan dataset.

3. The MRI system of claim 2,
   wherein said generation of one or more image reconstruction maps comprises using said EPI prescan dataset to generate a Nyquist ghost correction map,
   wherein said warping of the one or more image reconstruction maps comprises determining differences in geometric distortion between the at least one main scan dataset and the EPI prescan dataset, and intentionally distorting respective prescan datasets including the generated Nyquist ghost correction map, using the determined differences, to have geometric distortions substantially similar to geometric distortions in said at least one main scan dataset, and
   wherein said forming of a diagnostic MR image includes using one or more of the intentionally distorted image reconstruction maps.

4. The MRI system of claim 1,
   wherein said warping the one or more image reconstruction maps comprises determining differences in geometric distortions between the at least one main scan dataset and one or more prescan datasets, and intentionally distorting the one or more prescan datasets to have geometric distortions substantially similar to the geometric distortions of the at least one main scan dataset, and
   wherein said forming of a diagnostic MR image includes using the one or more intentionally distorted image reconstruction maps.

5. The MRI system of claim 1, wherein the one or more image reconstruction maps include one or both of a coil sensitivity map and a parallel imaging unfolding map.

6. The MRI system of claim 5,
   wherein said one or more image reconstruction maps comprises a Nyquist ghost correction map,
   wherein the Nyquist ghost correction map is used to deghost the at least one main scan dataset,
   wherein said warping of the one or more image reconstruction maps comprises determining differences in geometric distortions between the at least one main scan dataset and one or more prescan datasets, and intentionally distorting at least one of the coil sensitivity map or the parallel imaging unfolding map, using the determined differences, to have geometric distortions substantially similar to geometric distortions in the deghosted main scan dataset,
   wherein said forming of a diagnostic MR image includes using the one or more intentionally distorted image reconstruction maps.

7. The MRI system according to claim 1, wherein the distortions in the at least one main scan dataset include geometric distortions in a direction of MRI phase encoding.

8. The MRI system according to claim 7, wherein relative distortion sensitivities are estimated based on differences in strength between magnetic gradient phase encoding blips used for the one or more prescans and magnetic gradient phase encoding blips used for the at least one main scan.

9. The MRI system according to claim 1, wherein difference in geometric distortion in the at least one main scan dataset and in the one or more prescan dataset is represented in at least one off-resonance map.

10. The MRI system according to claim 1, wherein the distortion estimates are generated by matching relative amplitudes on integrals of signal level along a phase encode direction.

11. The MRI system according to claim 9, wherein the integrals are normalized with respect to each other.

12. The MRI system according to claim 1, wherein the main scan and the one or more prescans utilize same readout magnetic gradient.

13. The MRI system according to claim 1, wherein said forming of a diagnostic MR image comprises:
    performing a first main MRI reconstruction of the main scan dataset without geometry correction;
    determining geometry modifications using a result of the first main MRI reconstruction; and
    performing a second main MRI reconstruction of the main scan dataset using at least the corrected geometry modifications.

14. A magnetic resonance imaging (MRI) method for effecting parallel MR imaging with reduced artifacts, said MRI method comprising:
    placing an object into an MRI gantry including a static magnetic field coil, gradient magnetic field coils, at least one radio frequency (RF) coil configured to receive nuclear magnetic resonance (NMR) RF signals from said object when located in the imaging volume;
    performing an MR imaging sequence comprising one or more prescans and at least one main scan of the object;
    generating one or more image reconstruction maps from one or more received prescan digital datasets;
    acquiring at least one main scan dataset from received main scan digital data;
    warping the one or more image reconstruction maps to include geometric distortions substantially corresponding to geometric distortion in the at least one main scan dataset;
    forming a diagnostic MR image of the object using the at least one main scan dataset and the warped one or more image reconstruction maps; and
    outputting the diagnostic MR image to a display, or data storage in a non-transient digital data storage medium, or an outbound data transmission port.

15. The MRI method according to claim 14, wherein the at least one main scan is an echo planar imaging (EPI) main scan, and wherein the one or more prescans include an EPI prescan producing an EPI prescan dataset.

16. The MRI method according to claim 15, wherein said generating one or more image reconstruction maps comprises using the EPI prescan dataset to generate a Nyquist ghost correction map,
    wherein said warping the one or more image reconstruction maps comprises determining differences in geometric distortion between the at least one main scan dataset and the EPI prescan dataset, and intentionally distorting respective prescan datasets including the generated Nyquist ghost correction map, using the determined differences, to have geometric distortions substantially similar to geometric distortions in said at least one main scan dataset, and
    wherein said forming a diagnostic MR image includes using one or more of the intentionally distorted image reconstruction maps.

17. The MRI method according to claim 16, wherein the warped one or more image reconstruction maps include coil sensitivity maps.

18. The MRI method according to claim 17, wherein the coil sensitivity maps are used in unfolding from aliased parallel imaging.

19. A non-transitory computer readable storage medium, having executable computer program instructions recorded thereon, which when executed by at least one processor of a magnetic resonance imaging (MRI) system having an MRI gantry including a static magnetic field coil, gradient magnetic field coils, at least one radio frequency (RF) coil configured to transmit RF signals into an imaging volume and a plurality of RF receiver coils configured to receive nuclear magnetic resonance (NMR) RF signals from an object located in the imaging volume, causes the at least one processor to generate a final MRI image having geometric distortion, by performing operations comprising:
    generating one or more image reconstruction maps from one or more received prescan digital datasets;
    acquiring at least one main scan dataset from received main scan digital data;
    warping the one or more image reconstruction maps to have geometric distortions substantially corresponding to geometric distortions in the at least one main scan dataset;
    forming the diagnostic MR image of the object using the at least one main scan dataset and the warped one or more image reconstruction maps; and
    outputting the diagnostic MR image to a display, or data storage in a non-transient digital data storage medium, or an outbound data transmission port.

* * * * *